United States Patent
Chen et al.

(10) Patent No.: US 10,903,090 B2
(45) Date of Patent: Jan. 26, 2021

(54) METHOD OF SINGULATE A PACKAGE STRUCTURE USING A LIGHT TRANSMITTING FILM ON A POLYMER LAYER

(71) Applicant: Taiwan Semiconductor Manufacturing Co., Ltd., Hsinchu (TW)

(72) Inventors: Cheng-Ting Chen, Taichung (TW); Ching-Hua Hsieh, Hsinchu (TW); Hsiu-Jen Lin, Hsinchu County (TW); Hao-Jan Pei, Hsinchu (TW); Wei-Yu Chen, Taipei (TW); Chia-Lun Chang, Tainan (TW); Chia-Shen Cheng, Hsinchu County (TW); Cheng-Shiuan Wong, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/414,763

(22) Filed: May 16, 2019

(65) Prior Publication Data
US 2020/0365420 A1   Nov. 19, 2020

(51) Int. Cl.
| H01L 21/02 | (2006.01) |
| H01L 21/56 | (2006.01) |
| H01L 21/78 | (2006.01) |
| H01L 23/28 | (2006.01) |
| H01L 23/544 | (2006.01) |

(52) U.S. Cl.
CPC ............ *H01L 21/561* (2013.01); *H01L 21/78* (2013.01); *H01L 23/28* (2013.01); *H01L 23/544* (2013.01); *H01L 2223/54426* (2013.01)

(58) Field of Classification Search
CPC . H01L 21/02076; H01L 21/561; H01L 21/78; H01L 24/95; H01L 2224/95
See application file for complete search history.

(56) References Cited

U.S. PATENT DOCUMENTS

| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |

(Continued)

*Primary Examiner* — Hoai V Pham
(74) *Attorney, Agent, or Firm* — JCIPRNET (57) ABSTRACT

A method of forming a package structure includes the following processes. A die is attached to a polymer layer. An encapsulant is formed over the polymer layer to encapsulate sidewalls of the die. A RDL structure is formed on the encapsulant and the die. A conductive terminal is electrically connected to the die through the RDL structure. A light transmitting film is formed on the polymer layer. An alignment process is performed, and the alignment process uses an optical equipment to see through the light transmitting film to capture the alignment information included in the polymer layer. A singulating process is performed to singulate the package structure according to the alignment information.

20 Claims, 8 Drawing Sheets

(56) References Cited

U.S. PATENT DOCUMENTS

| | | |
|---|---|---|
| 9,496,189 B2 | 11/2016 | Yu et al. |
| 2014/0183761 A1* | 7/2014 | Lin .................. H01L 21/568 |
| | | 257/787 |

* cited by examiner

METHOD OF SINGULATE A PACKAGE STRUCTURE USING A LIGHT TRANSMITTING FILM ON A POLYMER LAYER

BACKGROUND

The semiconductor industry has experienced rapid growth due to continuous improvements in the integration density of various electronic components (i.e., transistors, diodes, resistors, capacitors, etc.). For the most part, this improvement in integration density has come from continuous reductions in minimum feature size, which allows more of the smaller components to be integrated into a given area. These smaller electronic components also demand smaller packages that utilize less area than previous packages. Some smaller types of packages for semiconductor components include quad flat packages (QFPs), pin grid array (PGA) packages, ball grid array (BGA) packages, flip chips (FC), three-dimensional integrated circuits (3DICs), wafer level packages (WLPs), and package on package (PoP) devices and so on.

Currently, integrated fan-out packages are becoming increasingly popular for their compactness.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "above", "upper" and the like, may be used herein for ease of description to describe one element or feature's relationship to another element(s) or feature(s) as illustrated in the FIGS. The spatially relative terms are intended to encompass different orientations of the device in use or operation in addition to the orientation depicted in the FIGS. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1G are schematic cross-sectional views illustrating a method of forming a package structure according to some embodiments of the disclosure.

Figure 1A:
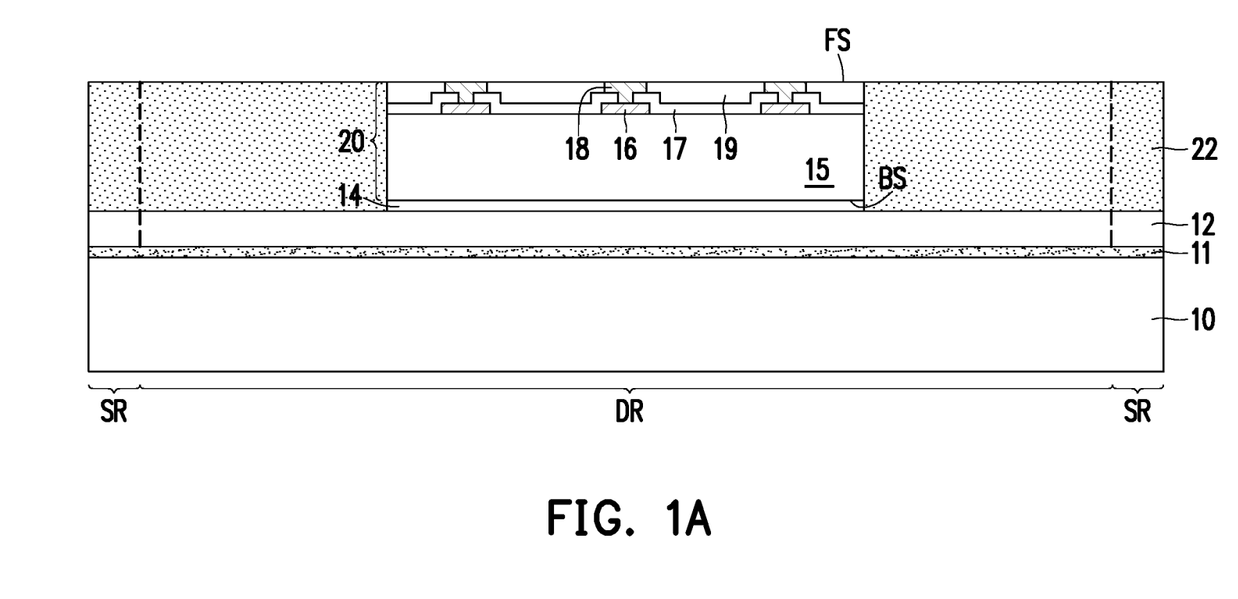
FIG. 1A to FIG. 1G are schematic cross-sectional views illustrating a method of forming a package structure according to some embodiments of the disclosure.

Referring to FIG. 1A, a carrier 10 is provided. The carrier 10 may be a glass carrier, a ceramic carrier, or the like or a combination thereof. In some embodiments, the carrier 10 has a shape similar to a wafer. For example, the carrier 10 is a round carrier, but the disclosure is not limited thereto. A de-bonding layer 11 is formed on the carrier 10 by, for example, a spin coating process, lamination process, or the like. In some embodiments, the de-bonding layer 11 may be formed of an adhesive such as an Ultra-Violet (UV) glue, a Light-to-Heat Conversion (LTHC) glue, or the like, or other types of adhesives. The de-bonding layer 11 is decomposable under the heat of light to thereby release the carrier 10 from the overlying structures that will be formed in subsequent steps.

A polymer layer 12 is formed on the de-bonding layer 11. The polymer layer 12 may be a single layer structure or a multi-layer structure. In some embodiments, the polymer layer 12 may include a photosensitive material such as polybenzoxazole (PBO), polyimide (PI), benzocyclobutene (BCB), ajinomoto buildup film (ABF), solder resist film (SR), or the like, or a combination thereof. In some other embodiments, the polymer layer 12 may be replaced by an inorganic dielectric layer. The inorganic dielectric layer may include a nitride such as silicon nitride, an oxide such as silicon oxide, an oxynitride such as silicon oxynitride, phosphosilicate glass (PSG), borosilicate glass (BSG), boron-doped phosphosilicate glass (BPSG), or the like, or a combination thereof. The polymer layer 12 is formed by a suitable fabrication technique such as spin-coating, lamination, deposition, or the like.

In some embodiments, the polymer layer 12 includes a plurality of die regions DR and scribe regions SR. The die regions DR are the regions in which dies are to be attached and package structures including the dies are to be formed. The scribe regions SR are the regions other than the die regions DR. In some embodiments, the die region DR is surrounded by the scribe region SR, and the die regions DR are spaced from each other by the scribe region SR therebetween. In some embodiments, the die regions DR are arranged in an array, but the disclosure is not limited thereto.

In some embodiments, conductive features may be formed within the die regions DR of the polymer layer 12. The conductive features may be a redistribution layer (RDL) structure including one or more layers of redistribution layers. The material of the conductive features (RDL structure) may include conductive materials such as metal, metal alloy, metal compound, or the like. In some embodiments, the conductive features include copper, nickel, titanium, the like, alloys thereof, or a combination thereof. The conductive features may be formed by physical vapor deposition process such as sputtering, plating process such as electroplating, or the like, or a combination thereof. However, the disclosure is not limited thereto.

In some embodiments, alignment marks may be formed within the scribe regions SR of the polymer layer 12. The alignment marks may be embedded in a bottom portion of the polymer layer 12 or penetrating trough the polymer layer 12. The bottom surface of the alignment marks may be exposed by the polymer layer 12 and coplanar with the bottom surface of the polymer layer 12, but the disclosure is not limited thereto. In some embodiments, the alignment marks may include a conductive material such as metal, metal alloy, metal compound, the like, or a combination thereof. The material of the alignment marks may be the same as or different from those of the conductive features formed in the die regions DR of the polymer layer 12. In some other embodiments, the alignment marks may be formed of a material which is recognizable by optical equipment such as an infrared (IR) camera or an IR microscope. However, the disclosure is not limited thereto. Depending on the product or process design, the alignment mark may include any suitable material used for alignment during subsequent singulating process.

Still referring to FIG. 1A, a die 20 is attached to the die region DR of polymer layer 12 over the carrier 10 through an adhesive layer 14 such as a die attach film (DAF), silver paste, or the like. In some embodiments, the die 20 is one of a plurality of dies cut apart from a wafer, for example. The number of the die 20 shown in the cross-sectional view FIG. 1C is merely for illustration, and the disclosure is not limited thereto. In some embodiments, two or more dies 20 may be mounted over the carrier 10, and the two or more dies 20 may be the same types of dies or the different types of dies. In some embodiments, the dies 20 may include an application-specific integrated circuit (ASIC) chip, an analog chip, a sensor chip, a wireless and radio frequency chip, a voltage regulator chip or a memory chips, or combinations thereof. In some embodiments, a plurality of dies 20 may be arranged in an array over the carrier 10, but the disclosure is not limited thereto.

Still referring to FIG. 1A, in some embodiments, the die 20 includes a substrate 15, a plurality of pads 16, a passivation layer 17, a plurality of connectors 18 and a passivation layer 19. In some embodiments, the substrate 15 is made of silicon or other semiconductor materials. Alternatively or additionally, the substrate 15 includes other elementary semiconductor materials such as germanium, gallium arsenic, or other suitable semiconductor materials. In some embodiments, the substrate 15 may further include other features such as various doped regions, a buried layer, and/or an epitaxy layer. Moreover, in some embodiments, the substrate 15 is made of an alloy semiconductor such as silicon germanium, silicon germanium carbide, gallium arsenic phosphide, or gallium indium phosphide. Furthermore, the substrate 15 may be a semiconductor on insulator substrate such as silicon on insulator (SOI) substrate or silicon on sapphire substrate.

In some embodiments, devices (not shown) are formed in or on the substrate 15. In some embodiments, the devices may be active devices, passive devices, or a combination thereof. In some embodiments, the devices are integrated circuit devices. The devices are, for example, transistors, capacitors, resistors, diodes, photodiodes, fuse devices, or the like. Interconnection structure and the dielectric structure may be formed over the devices on the substrate 15. Interconnection structure is formed in the dielectric structure and connected to different devices to form a functional circuit. In some embodiments, the dielectric structure includes an inter-layer dielectric layer (ILD) and one or more inter-metal dielectric layers (IMD). In some embodiments, the Interconnection structure includes multiple layers of metal lines and plugs (not shown). The metal lines and plugs include conductive materials, such as metal, metal alloy or a combination thereof. For example, the conductive material may include tungsten (W), copper (Cu), copper alloys, aluminum (Al), aluminum alloys, or combinations thereof. The plugs include contact plugs and via plugs. The contact plugs are located in the ILD to be connected to the metal lines and the devices. The via plugs are located in the IMD to be connected to the metal lines in different layers.

The pads 16 may be a top conductive feature of the interconnection structure and electrically connected to the devices, so as to provide an external connection of the die 20. The material of the pads 16 may include metal or metal alloy, such as aluminum, copper, nickel, or alloys thereof.

The passivation layer 17 is formed over the substrate 15 and covers a portion of the pads 16. A portion of the pads 16 is exposed by the passivation layer 17 and serves as an external connection of the die 20. The connectors 18 are formed on and electrically connected to the pads 16 not covered by the passivation layer 17. The connector 18 includes solder bumps, gold bumps, copper bumps, copper posts, copper pillars, or the like. The passivation layer 19 is formed over the passivation layer 17 and laterally aside the connectors 18 to cover the sidewalls of the connectors 18. The passivation layers 17 and 19 respectively include an insulating material such as silicon oxide, silicon nitride, polymer, or a combination thereof. The polymer is, for instance, polybenzoxazole (PBO), polyimide (PI), benzocyclobutene (BCB), a combination thereof, or the like. The materials of the passivation 17 and the passivation layer 19 may be the same or different. In some embodiments, the top surface of the passivation layer 19 is substantially level with the top surface of the connectors 18.

The die 20 includes a front surface FS and a back surface BS opposite to each other. The front surface FS refers to the surface constituted by the top surface of the passivation layer 19 and the top surface of the connectors 18. In some embodiments, the front surface FS may also be referred to as an active surface of the die 20. The back surface BS is the bottom surface of the substrate 15 and is in contact with the die attach film 14. The die 20 has a front side and a back side corresponding to the front surface FS and the back surface BS, respectively. The front side refers to the side close to and over the front surface FS, and the back side refers to the side close to the back surface BS, and opposite to the front side.

Still referring to FIG. 1A, an encapsulant 22 is then formed over the carrier 10 to encapsulate the sidewalls of the die 20. In some embodiments, the encapsulant 22 includes a molding compound, a molding underfill, a resin such as epoxy, a combination thereof, or the like. In some other embodiments, the encapsulant 22 includes a photo-sensitive material such as polybenzoxazole (PBO), polyimide, benzocyclobutene (BCB), a combination thereof, or the like, which may be easily patterned by exposure and development processes or laser drilling process. In alternative embodiments, the encapsulant 22 includes nitride such as silicon nitride, oxide such as silicon oxide, phosphosilicate glass (PSG), borosilicate glass (BSG), boron-doped phosphosilicate glass (BPSG), a combination thereof, or the like. The encapsulant 22 is formed by forming an encapsulant material layer on the polymer layer 12 over the carrier 10 by a suitable fabrication technique such as molding process, spin-coating process, lamination process, deposition process, or similar processes. The encapsulant material layer covers the top surface of the polymer layer 12, the top surfaces and sidewalls of the die 20. Thereafter, a grinding or polishing process such as a chemical mechanical polishing (CMP) process is performed to remove a portion of the encapsulant material layer above the front surface FS of the die 20, such that the top surfaces of the connectors 18 (that is, the front surface FS of the die 20) are exposed. In some embodiments, the top surface of the encapsulant 22 is substantially coplanar with the front surface FS of the die 20.

Figure 1B:
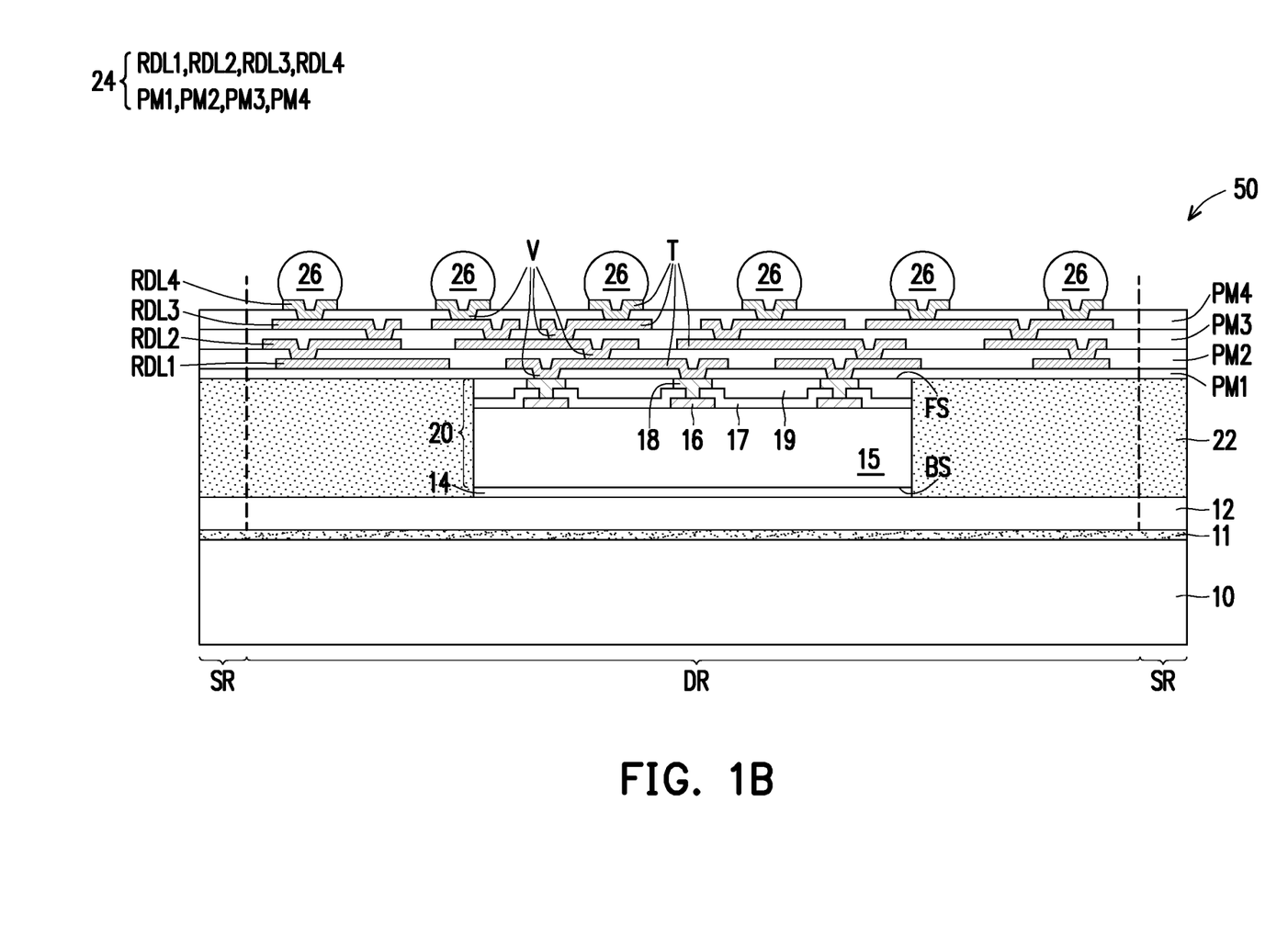
Figure 1C:
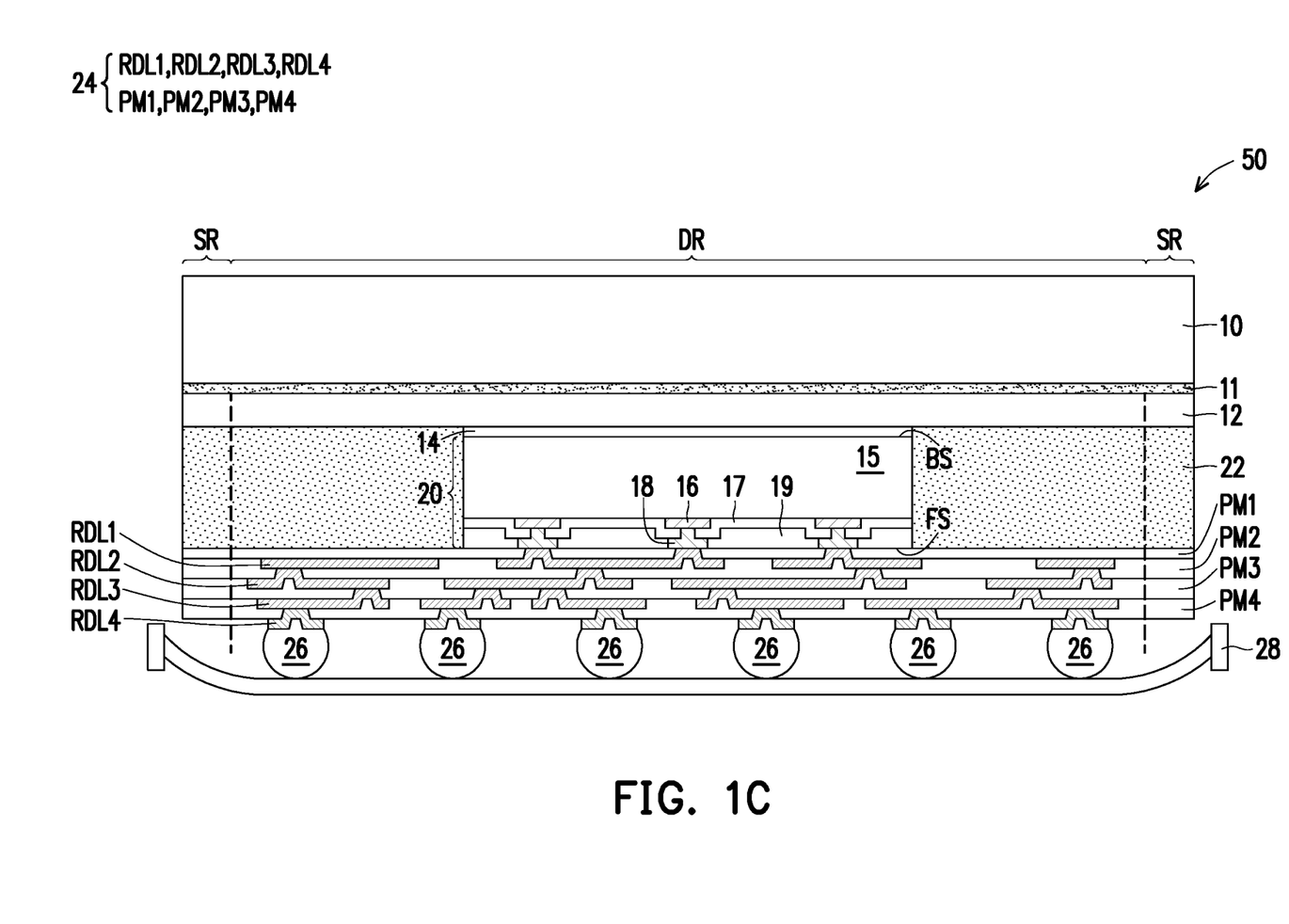

Referring to FIG. 1B, a redistribution layer (RDL) structure 24 is formed over and electrically connected to the die 20. The RDL structure 24 is located on front side of the die 20, and may be referred to as a "front-side redistribution layer structure". In some embodiment in which RDL structure is formed within the die region DR of the polymer layer 12, the RDL structure in the polymer layer 12 may also be referred to as a "back-side redistribution layer structure". In such embodiments, through integrated fan-out vias (TIVs) (not shown) may further be formed laterally aside the die 20. The TIVs penetrates trough the encapsulant 22 to electrically connect the back side RDL structure to the front side RDL structure 24. The sidewalls of the TIVs may be encapsulated by the encapsulant 22. However, the disclosure is not limited thereto. RDL structures may be formed on front side, back side, or both front side and back side of the die 20 according to product design.

In some embodiments, the RDL structure 24 includes a plurality of polymer layers PM1, PM2, PM3 and PM4 and a plurality of redistribution layers RDL1, RDL2, RDL3 and RDL4 stacked alternately. The number of the polymer layers or the redistribution layers shown in FIG. 1B is merely for illustration, and the disclosure is not limited thereto.

The redistribution layer RDL1 penetrates through the polymer layer PM1 and is physically and electrically connected to the connectors 18 of the die 20. The redistribution layer RDL2 penetrates through the polymer layer PM2 and is electrically connected to the redistribution layer RDL1. The redistribution layer RDL3 penetrates through the polymer layer PM3 and is electrically connected to the redistribution layer RDL2. The redistribution layer RDL4 penetrates through the polymer layer PM4 and is electrically connected to the redistribution layer RDL3.

The material of the polymer layer PM1, PM2, PM3, PM4 may be the same as or different from the material of the polymer layer 12. In some embodiments, each of the polymer layers PM1, PM2, PM3 and PM4 includes a photosensitive material such as PBO, PI, BCB, a combination thereof or the like. In some embodiments, the polymer layer 12 is also referred to as a polymer layer PM0. In some embodiments, the polymer layer PM1, PM2, PM3, PM4 may also be replaced by an inorganic dielectric layer including a dielectric material the same as or different from those of the polymer layer 12.

In some embodiments, each of the redistribution layers RDL1, RDL2, RDL3 and RDL4 includes conductive materials. The conductive materials includes metal such as copper, nickel, titanium, a combination thereof or the like, and is formed by an electroplating process. In some embodiments, the redistribution layers RDL1, RDL2, RDL3 and RDL4 respectively includes a seed layer (not shown) and a metal layer formed thereon (not shown). The seed layer may be a metallic seed layer such as a copper seed layer. In some embodiments, the seed layer includes a first metal layer such as a titanium layer and a second metal layer such as a copper layer over the first metal layer. The metal layer may be copper or other suitable metals.

In some embodiments, the redistribution layers RDL1, RDL2, RDL3 and RDL4 respectively includes a plurality of vias V and a plurality of traces T connected to each other. The vias V vertically penetrate through the polymer layers PM1, PM2, PM3 and PM4 to connect the traces T of the redistribution layers RDL1, RDL2, RDL3 and RDL4, and the traces T are respectively located on the polymer layers PM1, PM2, PM3 and PM4, and are respectively horizontally extending on the top surface of the polymer layers PM1, PM2, PM3 and PM4.

In some embodiments, the redistribution layer RDL4 is the topmost redistribution layer of the RDL structure 24, and is referred to as under-ball metallurgy (UBM) layer for ball mounting.

Still referring to FIG. 1B, thereafter, a plurality of connectors 26 are formed over and electrically connected to the redistribution layer RDL4 of the RDL structure 24. In some embodiments, the connectors 26 are referred as conductive terminals. In some embodiments, the connectors 26 may be ball grid array (BGA) connectors, solder balls, controlled collapse chip connection (C4) bumps, or a combination thereof. In some embodiments, the material of the connector 26 includes copper, aluminum, lead-free alloys (e.g., gold, tin, silver, aluminum, or copper alloys) or lead alloys (e.g., lead-tin alloys). The connector 26 may be formed by a suitable process such as evaporation, plating, ball dropping, screen printing and reflow process, a ball mounting process or a C4 process. In some embodiments, metal posts or metal pillars (not shown) may further be formed between the redistribution layer RDL4 and the connectors 26, but the disclosure is not limited thereto. The connectors 26 are electrically connected to the connectors 18 of the dies 20 through the RDL structure 24. As such, a structure 50 is formed on the carrier 10, wherein the die 20, the RDL structure 24 and the conductive terminals 26 are formed within the die regions DR.

Figure 1D:
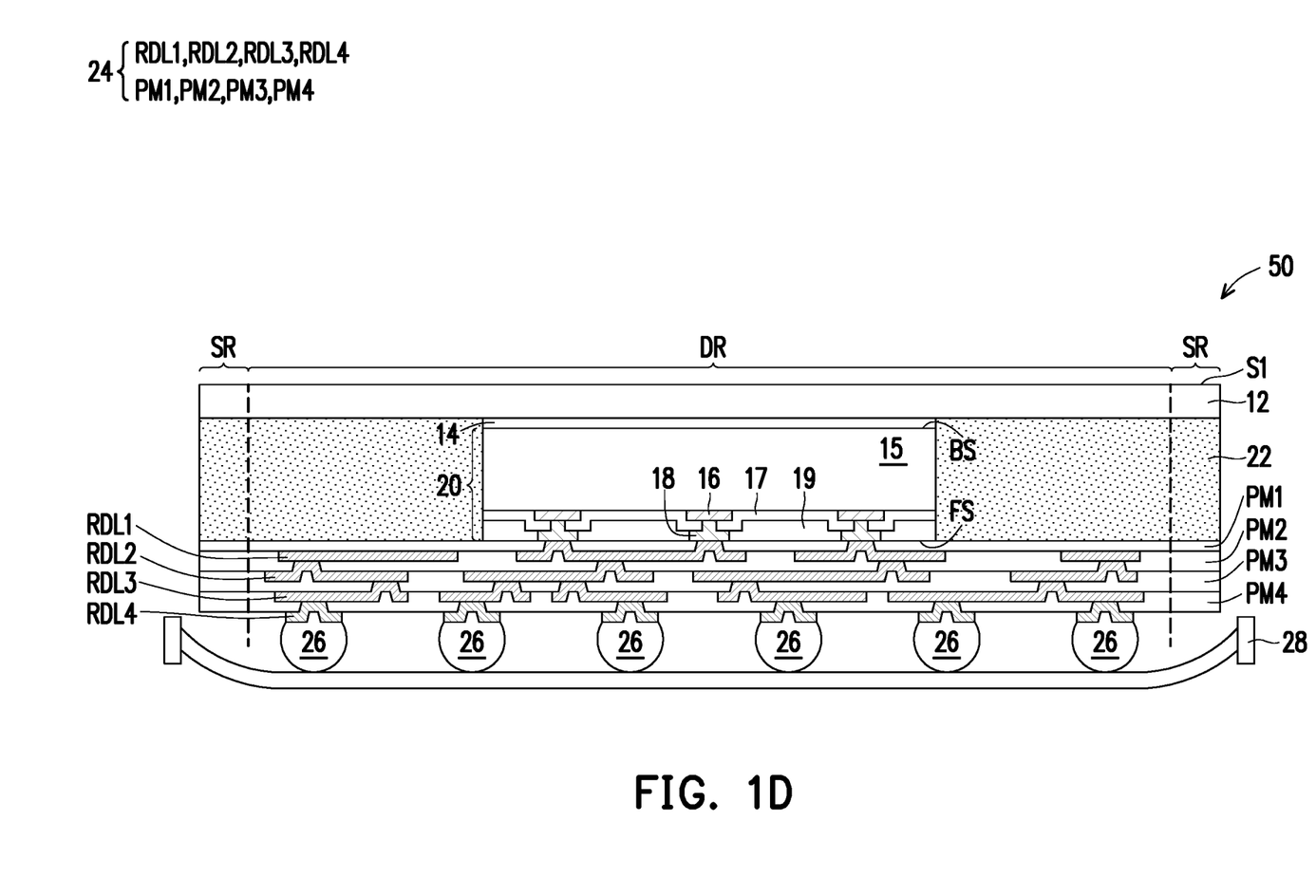

Referring to FIG. 1B and FIG. 1C, the structure shown in FIG. 1B is turned over and attached to a frame (tape) 28. Specifically, the conductive terminals 26 are attached to and contacts with the frame tape 28. As such, the back side of the die 20 is upward. Thereafter, as shown in FIG. 1C and FIG. 1D, The carrier 10 is de-bonded from the polymer layer 12. In some embodiments, the de-bonding layer 11 is decomposed under the heat of light, and the carrier 10 is then released from the polymer layer 12 of the structure 50.

Referring to FIG. 1D, in some embodiments, after the carrier 10 is released, one or more cleaning processes are performed to clean the surface (top surface) S1 of the polymer layer 12. In some embodiments, the cleaning processes include a water cleaning process, a plasma cleaning process, or the like or a combination thereof. In some embodiments, a water cleaning process is firstly performed, and then a baking process is performed to remove the water or water vapor remained on the polymer layer 12. Thereafter, a plasma cleaning process is performed on the polymer layer 12. In some embodiments, the cleaning processes are performed to remove the de-bonding layer residue or some other impurities on the polymer layer 12, such that the polymer layer 12 has a clean and flat surface S1 for subsequent processes.

Figure 1E:
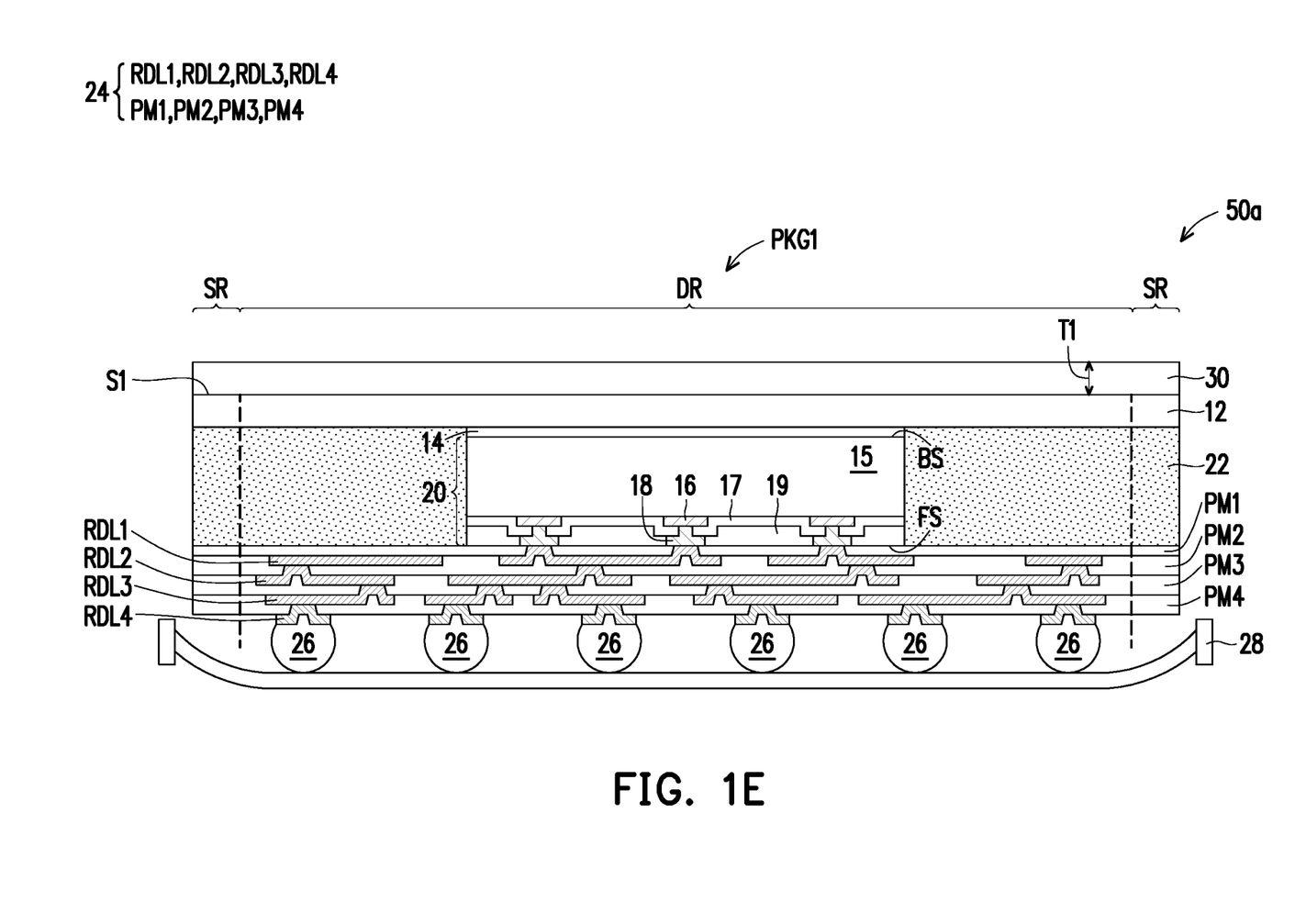

Referring to FIG. 1E, a film 30 is formed on the polymer layer 12. In some embodiments, the cleaning processes described above may help to increase the adhesion between the polymer layer 12 and the film 30. In some embodiments, the film 30 is a light transmitting film capable of transmitting light in a certain wavelength range. That is, the light transmitting film 30 is transparent to the light in a certain wavelength range. For example, the light transmitting film 30 includes an IR transmitting film, such as an IR LC tape, but the disclosure is not limited thereto. In some embodiments, the material of the film 30 is a composite material including acrylic ester co-polymer, epoxy resin, silica, and pigment additive, or/and the like. However, the disclosure is not limited thereto. The film 30 may include any suitable material as long as the film 30 is capable of transmitting a light in a certain wavelength range such as IR. The film 30 may be formed by a lamination process and a curing process, a deposition process, a spin coating process, or the like, or a combination thereof.

In some embodiments, the transmittance of the light transmitting film 30 in a light wavelength range of 400 nm to 1600 nm gradually increased as the wavelength increases. For example, the transmittance of the light transmitting film 30 increases from 0 to 50% as the wavelength increases from 400 nm to 1600 nm.

In some embodiments, the light transmittance of the film 30 in visible light wavelength range is less than the light transmittance of the film 30 in infrared wavelength range. In some embodiments, the film 30 is opaque under visible light while transparent under IR light, but the disclosure is not limited thereto. The wavelength range of visible light is from about 390 nm to about 700 nm. In some embodiments, the light transmittance of the film 30 in a visible light wavelength range is relatively low which approaching to 0, such as 0 to 15% or 0 to 10%. The wavelength range of infrared is from about 760 nm to about 1 mm. Throughout the specification, infrared (IR) includes near infrared (NIR), middle infrared (MIR), far infrared (FIR), any other kind of infrared or combinations thereof. In some embodiments, the light transmittance of the film 30 in the infrared wavelength range of 760 nm to 1600 nm is larger than 15%, such as 20% to 30%, 20% to 40%, or 20% to 50%, but the disclosure is not limited thereto. In some embodiments, the light transmittance of the film 30 in the infrared wavelength range larger than 1600 nm may be greater than 50%, but the disclosure is not limited thereto.

Still referring to FIG. 1E, in some embodiments, the light transmitting film 30 is black, but the disclosure is not limited thereto. In some other embodiments, the light transmitting film may also be white or colored. In some embodiments, the light transmitting film 30 has the thickness T1. It is noted that, the light transmittance of the film 30 described above refers to the light transmittance in the film 30 thickness direction, that is, in the direction perpendicular to the back surface BS of the die 20.

In some embodiments, the film 30 may also serve as a protection layer of the underlying structure 50. In some embodiments, the film 30 has an enhanced property to increase the reliability of the subsequently formed package structure. For example, the film 30 has a good adhesion with the polymer layer 12, and has a good heat resistance. For example, the temperature of the heat resistance of the film 30 ranges from 65° C. to 150° C. or higher than 150° C., but the disclosure is not limited thereto.

In some embodiments, after the film 30 is formed, a laser marking process is performed to form various marks on the film 30. The marks may include the product information of the die 20 or the package, such as a serial number of the die 20, the coordinate (that is, the location) of the die 20 in the die array, or product specification, the like, or some other kind of product information or combinations thereof. However, the disclosure is not limited thereto.

As such, a structure 50a including the structure 50 (FIG. 1D) and the film 30 is formed and attached on the frame tape 28. The structure 50a includes the package structures PKG1. The package structures PKG1 are formed in the die regions DR and spaced from each other by the scribe region SR.

Figure 1F:
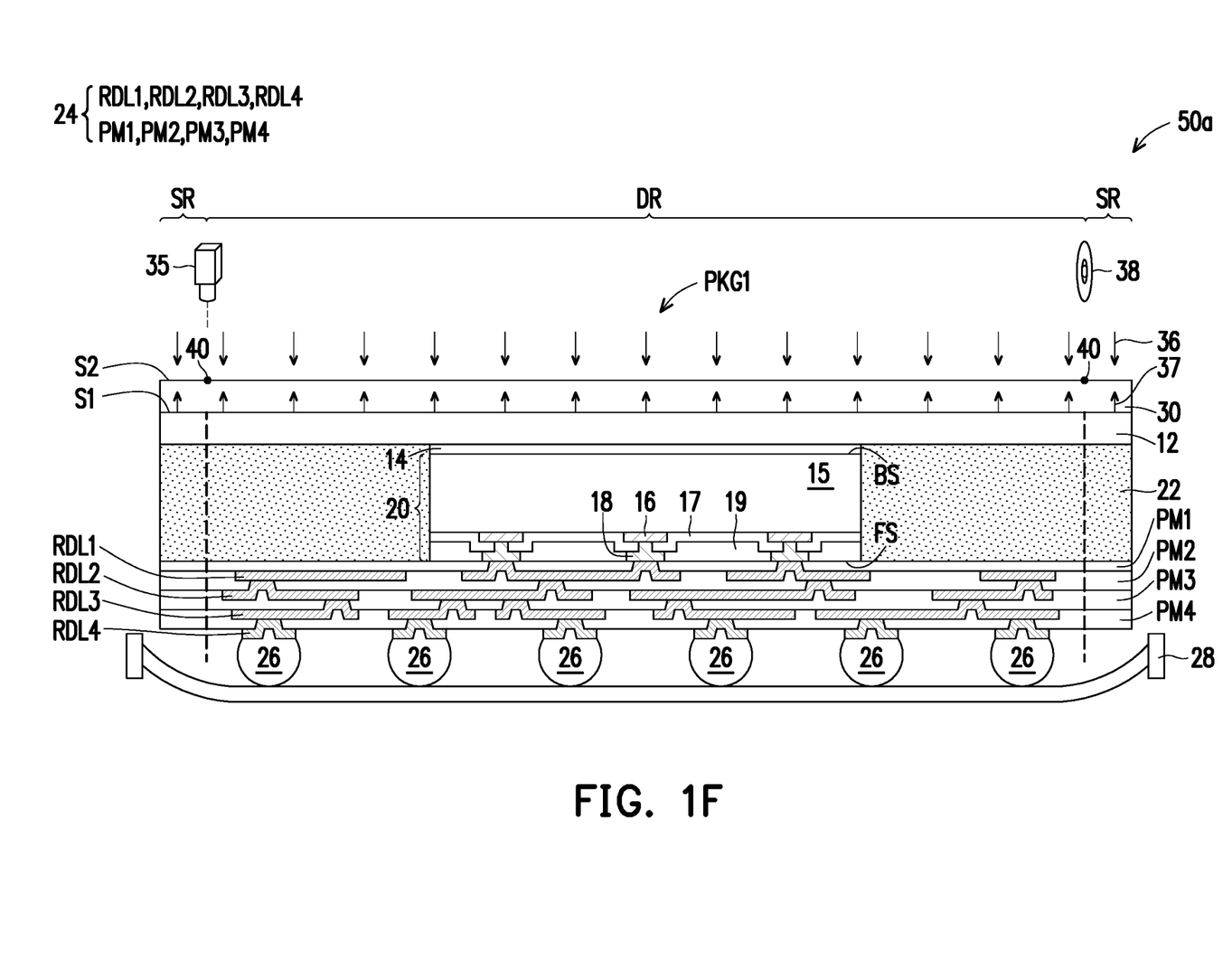

Referring to FIG. 1F, thereafter, a singulating process is performed to singulate the structure 50a into a plurality of single package structures PKG1. In some embodiments, the singulating process includes a mechanical saw (or dicing) process, laser process, plasma process, the like, or a combination thereof. The following is described taken the mechanical saw process as an example, and it is understood that the disclosure is not limited thereto.

In some embodiments, the singulating process is performed from the back side of the dies 20. During the singulating process, the conductive terminals 26 is still attached to and in physical contact with the frame tape 28, while the film 30 on the polymer layer 12 over the back side the die 20 is exposed, and the singulating process is performed from a start point 40 within the scribe region SR on the top surface S2 of the film 30.

In some embodiments, the alignment information for the singulating process, such as the profile (or the location) of the scribe region SR and die regions DR and alignment marks are included in the polymer layer 12, and are not included in the film 30. As indicated above, the film 30 is a light transmitting film which is transparent or perspective in a certain light wavelength range, and the polymer layer 12 underlying the film 30 is visible under the light in the certain wavelength range. In some embodiments, the singulating process uses an optical equipment 35 to see through the film 30 to obtain the alignment information included in the polymer layer 12, such as included in the surface S1 of the polymer layer 12, so as to do alignment. In other words, an alignment process is performed using the optical equipment 35 to capture the alignment information included in the polymer layer 12, and the singulating process is performed according to the alignment information.

In some embodiments, the optical equipment 35 includes an illumination module and an image capturing module. The illumination module may output or irradiate a light (such as 36) in a certain wavelength range toward a target object, and the image capturing module receives the reflected light (such as 37) of the light (such as 36) irradiated on the target object, so as to obtain an image of the reflect surface. In this embodiments, the target object is the structure 50a. The wavelength of the light 36 is corresponding to the light wavelength which the film 30 can transmit through, that is, the illumination module may output the light 36 in the wavelength range which may transmit through the film 30. In the embodiments in which the film 30 is an IR transmitting film (that is, the film 30 is transparent and the polymer layer 12 is visible under an IR light), the optical equipment 35 includes an IR equipment. The IR equipment may include an IR illumination module outputting an IR light (or ray). Herein, the IR equipment includes NIR equipment, MIR equipment, FIR equipment, the like, or combinations thereof. In some embodiments, the IR equipment includes IR camera, IR microscope, the like, or a combination thereof. However, the disclosure is not limited thereto.

Referring to FIG. 1F, in some embodiments, during the singulating process, the optical equipment 35 is disposed over the surface (top surface) S2 of the film 30. That is, the distance between the optical equipment 35 and the film 30 is less than the distance between the optical equipment 35 and the conductive terminals 26 in a vertical direction. In other words, the film 30 is closer to the optical equipment 35 than the conductive terminals 26 in a direction perpendicular to surfaces FS/BS of the die 20.

In some embodiments, the illumination module of the optical equipment 35 irradiates the light (or ray) 36 in a certain wavelength range, such as an IR light (or IR ray) toward the top surface S2 of the film 30. In some embodiments, the wavelength of the light 36 ranges from about 760 nm to about 1 mm, such as about 800 nm to about 1600 nm, such as about 800 nm, 1000 nm, 1200 nm, 1400 nm or 1600 nm, or any infrared having other wavelength, for example. In some embodiments, the irradiation direction of the light 36 is perpendicular to the top surface S2 of the film 30, but the disclosure is not limited thereto.

The light 36 irradiates on the top surface S2 of the film 30 and transmits through the film 30. In some embodiments, the transmitted light 36, that is, the light transmitted through the film 30 is reflected at the location of the surface (top surface) S1 of the polymer layer 12, that is the interface between the film 30 and the polymer layer 12. In some embodiments, different regions in the surface S1 of the polymer layer 12 have different reflectance to the transmitted light 36. For example, the reflectance of the scribe regions SR to the light 36 is different from the reflectance of the die regions DR to the light 36. In some embodiments, the reflected lights 37 from the surface S1 of the polymer layer 12 transmits through the film 30 and is received by the image capturing module of the optical equipment 35, thereby obtaining the image including the surface information of the surface S1 of the polymer layer 12. In some embodiments, the surface information of the surface S1 of the polymer layer 12 includes the alignment information for the singulating process. The alignment information includes, for example, the profile (or the location) of the scribe region SR and die regions DR and the location of the alignment marks. In some embodiments, the image obtained by the image capturing module may be shown in a display device. However, the disclosure is not limited thereto.

Figure 2:
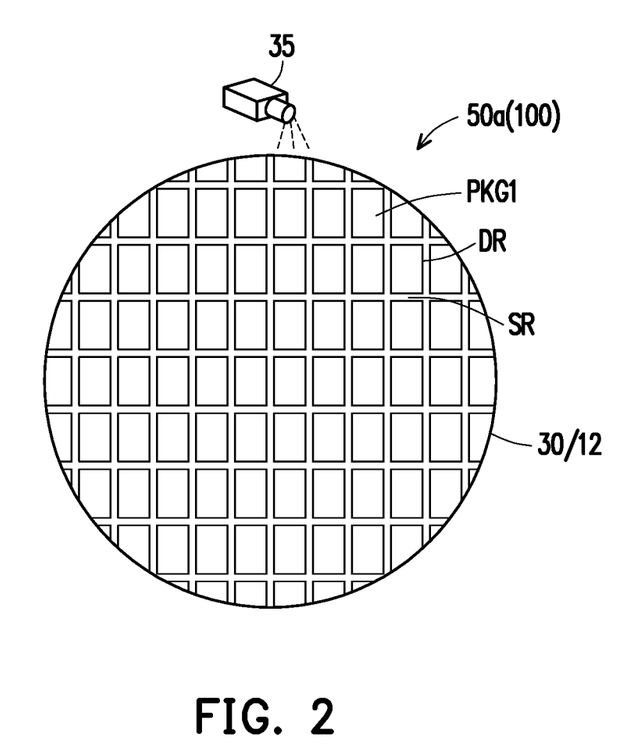
FIG. 2 is a schematic cross-sectional view illustrating an image captured by an optical equipment according to some embodiments of the disclosure.

FIG. 2 illustrates a top view of the structure 50a under the optical equipment 35, as well as an image 100 including the surface information of the surface S1 of the polymer layer 12 captured by the optical equipment 35 according to some embodiments of the disclosure. Referring to FIG. 2, under the optical equipment 35, such as an IR equipment, the film 30 is seen through (or transparent), and the scribe regions SR and the die regions DR of the polymer layer 12 are visible. In other words, the image 100 shows the profile and location of the scribe regions SR and the die regions DR in the polymer layer 12. In some embodiments in which alignment marks are formed in the scribe regions SR, the profile and location of the alignment marks may also be shown in the image 100.

As shown in FIG. 1F and FIG. 2, in some embodiments, the structure 50a includes a plurality of package structures PKG1 arranged in an array. The package structures PKG1 are located in die regions DR and are spaced from each other by scribe regions SR. In some embodiments, various alignment marks may be formed in the scribe regions SR, but the disclosure is not limited thereto.

In some embodiments, when performing the alignment, the optical equipment 35 may be disposed over a center region of the structure 50a, such that the whole structure 50a is in the illumination range of the optical equipment 35, but the disclosure is not limited thereto. In some other embodiments, a plurality of optical equipments 35 are located over different regions of the structure 50a, respectively. The position of the optical equipment 35 shown in FIG. 1F and FIG. 2 is merely for illustration, and the disclosure is not limited thereto. The optical equipment 35 may be disposed at any location over the structure 50a, as long as the alignment information included in the polymer layer 12 is captured by the optical equipment 35.

Still referring to FIG. 1F and FIG. 2, with the alignment information captured by the optical equipment 35, the singulating process is performed along the scribe regions SR. In some embodiments, the singulating process is performed from a start point 40 on the top surface S2 of the film 30 directly over the scribe region SR of polymer layer 12. In some embodiments in which the singulating process includes a mechanical saw process, a saw tool, such as a saw blade 38 is used to singulate the structure 50a into a plurality of single package structures PKG1. The saw blade 38 enters the structure 50a at the start point 40, and saw the structure 50a along the scribe region SR. However, the disclosure is not limited thereto.

Figure 1G:
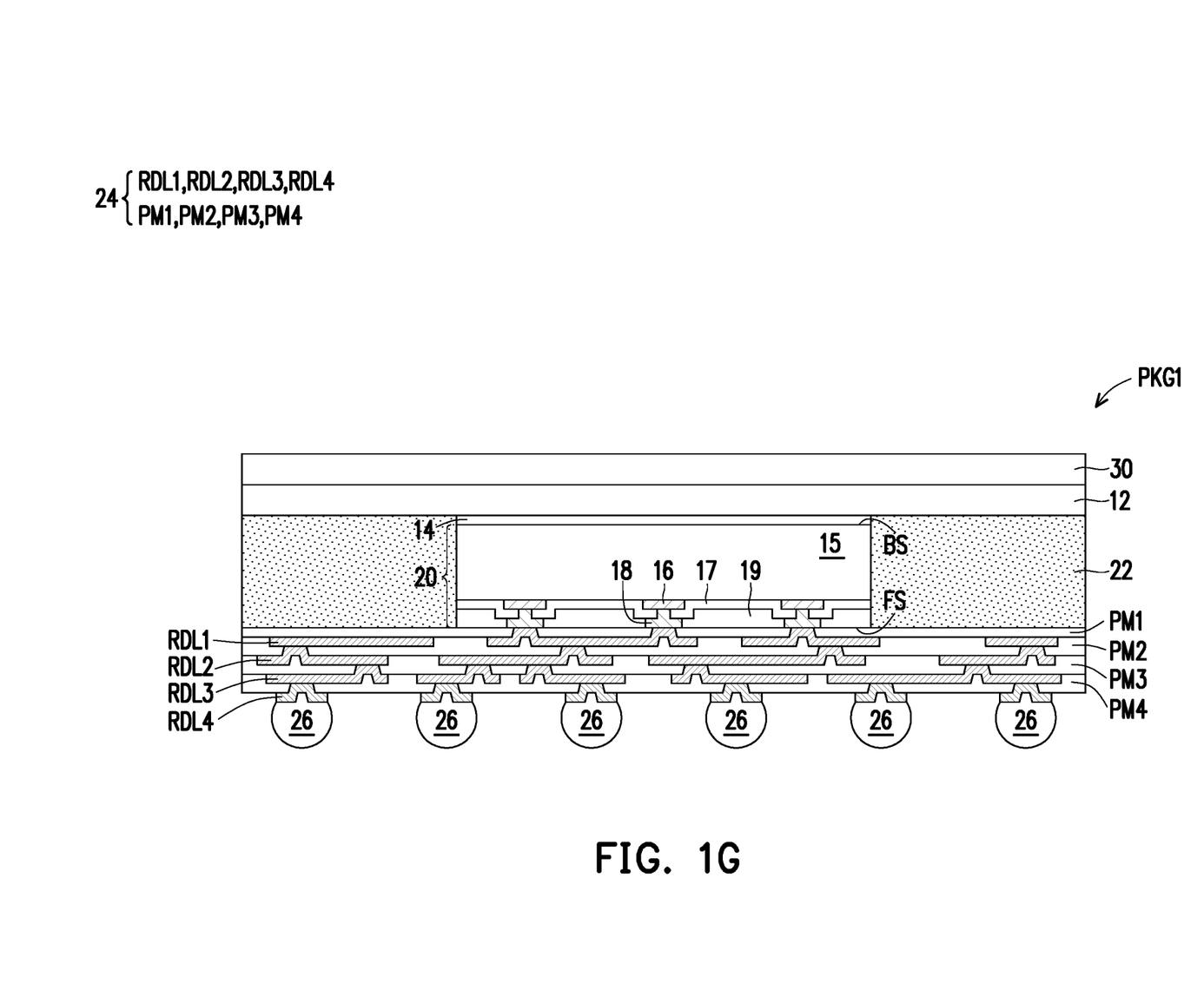

Referring to FIG. 1F and FIG. 1G, after the singulating process, the frame tape 28 is removed. In the embodiments of the disclosure, the frame tape 28 is attached to the conductive terminals 26 before the carrier 10 de-bonding process (FIG. 1C) and removed after the singulating process. That is, the frame tape 28 is attached to and in contact with the conductive terminals 26 throughout the carrier de-bonding process and the singulating process. In other words, the carrier de-bonding process and the singulating process use a same frame tape 28.

Referring to FIG. 1G, A plurality of package structures PKG1 is thus formed, wherein one of the package structures PKG1 is illustrated in FIG. 1G. In some embodiments, the package structure PKG1 includes the die 20, the encapsulant 22, the RDL structure 24, the conductive terminals 26, the polymer layer 12 and the film 30. In some embodiments, the RDL structure 24 is a front-side RDL structure located on front side of the die 20. The polymer layer 12 and the film 30 are located at back side of the die 20. In some embodiments, the film 30 is a light transmitting film, such as an IR transmitting film. In some embodiments, a cleaning process may further be performed to clean the package structures PKG1.

In the embodiments of the disclosure, a light transmitting film such as an IR transmitting film is formed on a polymer layer over a back side of the die. The light transmitting film is capable of transmitting the light in a certain wavelength range, such as in IR wavelength range. Therefore, the light transmitting film is transparent and the polymer layer underlying the light transmitting film is visible and could be recognized under a light in the certain wavelength range (such as an IR light). As such, the singulating process may be performed from back side of the die using an optical equipment (such as IR equipment) to do the alignment. The optical equipment may see through the light transmitting film to capture the alignment information included in the polymer layer, so as to do the alignment. On the other hand, in the embodiments of the disclosure, since the singulating process is performed from the back side of the die, a same frame tape may be used for the carrier releasing process and the singulating process. Therefore, fewer process station is needed, and the process cost is reduced. Further, since the light transmitting film including the material having an enhanced property, the reliability and yield of the package structure is also increased.

In accordance with some embodiments of the disclosure, a method of forming a package structure includes the following processes. A die is attached to a polymer layer. An encapsulant is formed over the polymer layer to encapsulate sidewalls of the die. A RDL structure is formed on the encapsulant and the die. A conductive terminal is electrically connected to the die through the RDL structure. A light transmitting film is formed on the polymer layer. An alignment process is performed, and the alignment process uses an optical equipment to see through the light transmitting film to capture the alignment information included in the polymer layer. A singulating process is performed to singulate the package structure according to the alignment information.

In accordance with alternative embodiments of the disclosure, a method of forming a package structure includes the following processes. A polymer layer is formed on a carrier. A die is attached to the polymer layer. An encapsulant is formed to encapsulate sidewalls of the die. A conductive terminal is formed to connect to the die through a RDL structure. The conductive terminal is attached to a frame tape. The carrier is released from the polymer layer. A film is formed on the polymer layer. A singulating process is performed from a start point located on the film; and the frame tape is removed.

In accordance with some embodiments of the disclosure, a package structure includes a die, an encapsulant, a RDL structure, a conductive terminal and a light transmitting film. The die has a front side and a back side opposite to each other. The encapsulant laterally encapsulates sidewalls of the die. The RDL structure is located on the front side of the die and the encapsulant. The conductive terminal is electrically connected to the die through the RDL structure. The light transmitting film is located on the back side of the die and the encapsulant.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A method of forming a package structure, comprising:
   attaching a die to a polymer layer;
   forming an encapsulant over the polymer layer to encapsulate sidewalls of the die;
   forming a redistribution layer (RDL) structure on the encapsulant and the die;
   forming a conductive terminal, electrically connected to the die through the RDL structure; and
   forming a light transmitting film on the polymer layer;
   performing an alignment process, wherein the alignment process uses an optical equipment to see through the light transmitting film to capture the alignment information included in the polymer layer; and
   performing a singulating process to singulate the package structure according to the alignment information.

2. The method of claim 1, wherein
   the die comprises a front side and a back side opposite to each other;
   the RDL structure and the conductive terminal are disposed on the front side of the die;
   the polymer layer and the light transmitting film are disposed on the back side of the die; and
   the singulating process is performed from the back side of the die.

3. The method of claim 1, wherein the performing the singulating process comprises:
   irradiating a light on the light transmitting film through an illumination module of the optical equipment, wherein the light transmits through the light transmitting film, and is reflected at a surface of the polymer layer; and
   receiving the reflected light by an image capturing module of the optical equipment, so as to obtain an image including the alignment information.

4. The method of claim 1, wherein the alignment information comprises a profile of a scribe region of the polymer layer, and the singulating process is performed along the scribe region.

5. The method of claim 1, wherein the light transmitting film comprises an infrared (IR) transmitting film.

6. The method of claim 1, wherein the optical equipment comprises an IR camera or an IR microscope.

7. The method of claim 1, wherein the light transmitting film is closer to the optical equipment than the conductive terminal during the singulating process.

8. The method of claim 1, further comprising performing a cleaning process on the polymer layer before forming the light transmitting film.

9. The method of claim 8, wherein the cleaning process comprises a water cleaning process, a plasma cleaning process, or a combination thereof.

10. The method of claim 1, wherein during the singulating process, the conductive terminal is attached to a frame tape.

11. A method of forming a package structure, comprising:
    forming a polymer layer on a carrier;
    attaching a die to the polymer layer;
    forming an encapsulant to encapsulate sidewalls of the die;
    forming a conductive terminal to connect to the die through a RDL structure;
    attaching the conductive terminal to a frame tape;
    releasing the carrier from the polymer layer;
    forming a film on the polymer layer;
    performing a singulating process from a start point located on the film; and
    removing the frame tape.

12. The method of claim 11, wherein during the singulating process, the conductive terminal is attached to the frame tape, and the film is exposed.

13. The method of claim 11, wherein the film is a light transmitting film.

14. The method of claim 13, wherein the light transmitting film is capable of transmitting an IR light.

15. The method of claim 14, wherein the performing the singulating process comprises:
    using an IR equipment to irradiate the IR light to the light transmitting film, such that a scribe region and a die region of the polymer layer underlying the light transmitting film are visible; and
    performing the singulating process along the scribe region.

16. The method of claim 15, wherein the IR equipment comprises an IR camera or an IR microscope.

17. The method of claim 13, wherein
    the die comprises a front side and a back side opposite to each other;
    the RDL structure and the conductive terminal are disposed on the front side of the die; and
    the polymer layer and the light transmitting film are disposed on the back side of the die;

18. The method of claim 17, wherein the singulating process is performed from the back side of the die.

19. The method of claim 13, further comprising performing a water cleaning process on the polymer layer before forming the light transmitting film.

20. The method of claim 11, further comprising performing a plasma cleaning process on the polymer layer before the forming the film.

* * * * *